(12) United States Patent
Bartko

(10) Patent No.: US 12,379,407 B2
(45) Date of Patent: Aug. 5, 2025

(54) SYSTEM AND METHOD FOR TESTING A DEVICE UNDER TEST

(71) Applicant: Rohde & Schwarz GmbH & Co. KG, Munich (DE)

(72) Inventor: Hendrik Bartko, Unterhaching (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 264 days.

(21) Appl. No.: 18/364,544

(22) Filed: Aug. 3, 2023

(65) Prior Publication Data

US 2025/0044337 A1    Feb. 6, 2025

(51) Int. Cl.
*G01R 29/10*    (2006.01)
*G01R 29/08*    (2006.01)

(52) U.S. Cl.
CPC ....... *G01R 29/105* (2013.01); *G01R 29/0878* (2013.01)

(58) Field of Classification Search
CPC .............. G01R 29/105; G01R 29/0878; G01R 31/31903; G01R 31/2813; G01R 29/10; G01R 29/0892; G01R 29/0871; G01R 29/0821; H04B 7/0617; H04B 7/04013; H04B 17/101; H04B 17/0087; H04B 17/0085; H01Q 3/46; H01Q 3/16; H01Q 19/132; H01Q 15/148; H01Q 15/0086; H01Q 15/0033; H01Q 15/002
See application file for complete search history.

(56) References Cited

U.S. PATENT DOCUMENTS

| | | | |
|---|---|---|---|
| 2019/0302184 A1* | 10/2019 | Rowell | G01R 31/2813 |
| 2020/0217885 A1* | 7/2020 | Rowell | G01R 31/3025 |
| 2020/0350691 A1* | 11/2020 | Somerlock, III | H01Q 15/0086 |
| 2022/0059943 A1 | 2/2022 | Saab et al. | |
| 2024/0410924 A1* | 12/2024 | Kuo | G01R 29/0871 |
| 2025/0007563 A1* | 1/2025 | Khayatzadeh | H04B 7/04013 |

* cited by examiner

*Primary Examiner* — Renan Luque
(74) *Attorney, Agent, or Firm* — Westman, Champlin & Koehler, P.A.

(57) ABSTRACT

A system for testing a device under test, DUT, comprises a holder configured to hold the DUT, wherein the DUT comprises at least one reconfigurable intelligent surface, RIS. A first antenna array generates plane waves at a position of the at least one RIS when the DUT is arranged on the holder. The first antenna array can generate plane waves having different angles of incidence at the position of the at least one RIS. A second antenna array receives a reflection signal originating from a reflection of a plane wave, wherein the plane wave is generated by the first antenna array and is reflected from the at least one RIS. A determination unit determines an angle of incidence on the second antenna array, using the received reflection signal.

15 Claims, 2 Drawing Sheets

SYSTEM AND METHOD FOR TESTING A DEVICE UNDER TEST

TECHNICAL FIELD

The present invention relates to a system and a method for testing a device under test (DUT), wherein the DUT comprises a reconfigurable intelligent surface (RIS).

BACKGROUND OF THE INVENTION

Conventionally, the radio channel between base stations (BS) and user equipment (UE) is considered to be given and inalterable. Electromagnetic waves interact with the environment, e.g. by absorption or reflection, and the radio channel therefore influences the propagation of data signals.

With new generations of broadband cellular network technology, in particular 5G and 6G, the influence of the environment on the data signals becomes even more important. The reason is that signals with high frequencies are used in these networks which cannot propagate over large distances and cannot penetrate walls.

Accordingly, there is a need to better control the interaction of radio signals with the environment. A particularly promising approach are reconfigurable intelligent surfaces (RIS). RIS are programmable structures that can control the reflection of electromagnetic waves. RIS can be strategically arranged in the environment, e.g. on walls, to steer signals in desired directions.

A reconfigurable surface for an antenna is known from US 2022/0059943 A1. The reconfigurable surface comprises a unit-cell with a first layer, a second layer and a middle layer.

In the development process of RIS, testing systems are used for testing devices under test (DUT) which comprise at least one RIS. The DUT is arranged on a holder and a test antenna generates electromagnetic waves which are directed towards the RIS. The properties of the RIS, in particular angles of deflection are measured, e.g., using another test antenna.

Of particular importance is the study of far field conditions, i.e. the study of plane waves arriving at the RIS. The far field is the range where the electromagnetic field is dominated by transverse electric or magnetic fields with electric dipole properties.

If D denotes the largest dimension of the test antenna which generates the electromagnetic field, the far field is defined as the region having a distance from the antenna which is larger than the Fraunhofer distance, defined by $$2 \cdot D^2 / \lambda,$$

where $\lambda$ is the wavelength of the emitted electromagnetic field.

This means that in the testing system, the minimal distance between the antenna and the DUT for testing far-field conditions is given by the Fraunhofer distance. This distance can become very large, e.g. in the range of tens of meters. Such a setup can therefore become extremely expensive.

Another object in the development process of RIS is studying RIS at different angles of incidence and reflection. This requires either many switchable antennas for the different angles or movable antennas.

Therefore, there is a need for more compact testing systems for testing RIS.

SUMMARY OF THE INVENTION

The present invention solves this problem by a system and a method for testing a DUT having the features of the independent claims. Further embodiments are subject matter of the dependent claims.

According to a first aspect, a system for testing a DUT is provided. The DUT comprises at least one RIS. The system comprises a holder configured to hold the DUT. The system further comprises a first antenna array configured to generate plane waves at a position of the at least one RIS when the DUT is arranged on the holder. The first antenna array can generate plane waves having different angles of incidence at the position of the at least one RIS. The system further comprises a second antenna array configured to receive a reflection signal originating from a reflection of a plane wave, wherein the plane wave is generated by the first antenna array and is reflected from the at least one RIS. A determination unit determines an angle of incidence on the second antenna array, using the received reflection signal.

According to a second aspect, a method for testing a DUT is provided. The DUT comprises at least one RIS. A first antenna array generates plane waves at a position of the at least one RIS, when the DUT is arranged on a holder. The first antenna array generates plane waves for at least two different angles of incidence at the position of the at least one RIS. A second antenna array receives, for each plane wave generated by the first antenna array, a respective reflection signal originating from a reflection of said plane wave from the at least one RIS. For each plane wave generated by the first antenna array, a respective angle of incidence on the second antenna array is determined, using the respective reflection signal.

The invention proposes generating plane waves with a first antenna array which can be controlled to generate plane waves at different angles of incidence. As compared to single antennas, antenna arrays can adjust the angle of incidence within a certain range. Likewise, the second antenna array can determine different angles of incidence on the second antenna array, corresponding to different angles of reflection at the RIS. Therefore, different angle of incidence on the RIS and corresponding angles of reflection can be studied in a simple and compact setup.

Further, the first antenna array can be configured in such a way that it can produce plane waves even if the first antenna array is located at relatively small distances from the holder with the DUT. Therefore, the system for testing the DUT can become very compact.

According to an embodiment of the system, the determination unit is configured to determine whether the determined angle of incidence on the second antenna array is within a predetermined range. In particular, the determination unit may determine whether the angle of incidence at the position of the RIS is below a predefined threshold. The determination unit may also determine whether the angle of incidence at the position of the RIS is above a predefined threshold. In this way, it is possible to determine whether the RIS has desired reflection properties.

According to an embodiment, the system comprises an anechoic chamber. The holder, the first antenna array and the second antenna array are arranged within the chamber. The anechoic chamber reduces unwanted disturbances from the environment. The quality of the testing thereby increases.

According to an embodiment, the system comprises at least one absorber configured to absorb electromagnetic radiation. The at least one absorber is arranged at least partially within a direct path between the first antenna array and the second antenna array. The absorber reduces or eliminates unwanted crosstalk between the first antenna array and the second antenna array.

According to an embodiment of the system, the holder is static. This can simplify the setup and can guarantee that the DUT is located at a precisely known location.

According to an embodiment of the system, the holder is configured to be movable in two dimensions or three dimensions. For example, the holder can be rotated to change the angle of incidence of the plane waves emitted from the first antenna array within a certain range. A translational motion of the holder can change the relative orientation between the DUT and the first and second antenna arrays. This allows testing the DUT under different conditions, e.g., different angles of incidence on the DUT.

According to an embodiment of the system, the first antenna array and the second antenna array are static. This can simplify the setup and can guarantee that the orientation of the first antenna array and the second antenna array relative to the holder is precisely known. In particular, the reproducibility of tests can improve.

According to an embodiment of the system, the first antenna array is movable. By moving the first antenna array, the angle of incidence at the position of the RIS can be adjusted. This possibility of adjustment can in some embodiments be provided in addition to a purely electronic adjustment of the angle of incidence of the plane wave at the position of the RIS.

According to an embodiment of the system, the second antenna array is movable. By moving the second antenna array, the RIS can be tested at different reflection angles.

According to an embodiment of the system, both the first antenna array and the second antenna array are movable. In this way, larger ranges of the angle of incidence of the plane waves at the position of the RIS and of the reflection angle at the RIS can be tested.

According to an embodiment of the system, at least one of the first antenna array and/or the second antenna array are movable on at least a portion of a sphere. The first antenna array and/or the second antenna array may be fixed on respective holders which can perform spherical movements. By such means, larger ranges of the angle of incidence of the plane waves at the position of the RIS and of the reflection angle at the RIS can be tested. At the same time, the distance between the first antenna array and the RIS and the distance between the second antenna array and the RIS remain constant.

According to an embodiment of the system, a distance between the first antenna array and the holder is smaller than $$2 \cdot D^2 / \lambda,$$

where D denotes a largest dimension of the first antenna array and $\lambda$ denotes a wave length of the plane waves generated by the first antenna array. The value $2 \cdot D^2/\lambda$ is the Fraunhofer distance which provides a limit between near field and far field.

The first antenna array can generate plane waves but does not need to be located at distances larger than the Fraunhofer distance $2 \cdot D^2/\lambda$. preferably, the distance between the first antenna array and the holder is significantly smaller than $2 \cdot D^2/\lambda$, e.g. by a factor of 10. That is, far field conditions (plane waves) can be generated with a compact setup of the system.

According to an embodiment of the system, a distance between the second antenna array and the holder is smaller than $$2 \cdot D^2 / \lambda,$$

According to an embodiment of the system, the first antenna array is a plane wave converter antenna. The plane wave converter antenna can be a phased antenna array which forms plane waves inside a specified quiet zone. The quiet zone can for example be of a diameter of more than 1 meter.

Plane wave converter antennas can generate plane waves at small distances from the DUT, e.g. a distance which is smaller than 1.5 meter. Such distances are significantly smaller than direct far field measurements with single antenna which require distances of tens of meters.

According to an embodiment of the system, the first antenna array subsequently generates plane waves at different angles of incidence at the position of the at least one RIS. For example, a list can be provided, e.g. based on a user interaction, which defines at least two different angles of incidence of the plane wave at the position of the at least one RIS. The first antenna array can be controlled to generate plane waves at the specified angles of incidence at the position of the at least one RIS, one after another. This allows determining the characteristics of the RIS over a range of angles of incidence on the RIS.

According to an embodiment of the system, the first antenna array simultaneously generates plane waves at different angles of incidence at the position of the at least one RIS. The received reflection signal will then comprise contributions from the reflection of the different plane waves at the RIS. Based on the determined angles of incidence at the second antenna array, each contribution can be associated with the corresponding plane wave, i.e., angle of incidence at the position of the RIS. In this embodiment, different scenarios can be tested simultaneously, which can make the testing faster. For example, the first antenna array may comprise subarrays, such that each separate subarray emits a respective plane wave with a respective angle of incidence at the position of the RIS.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

Figure 1:
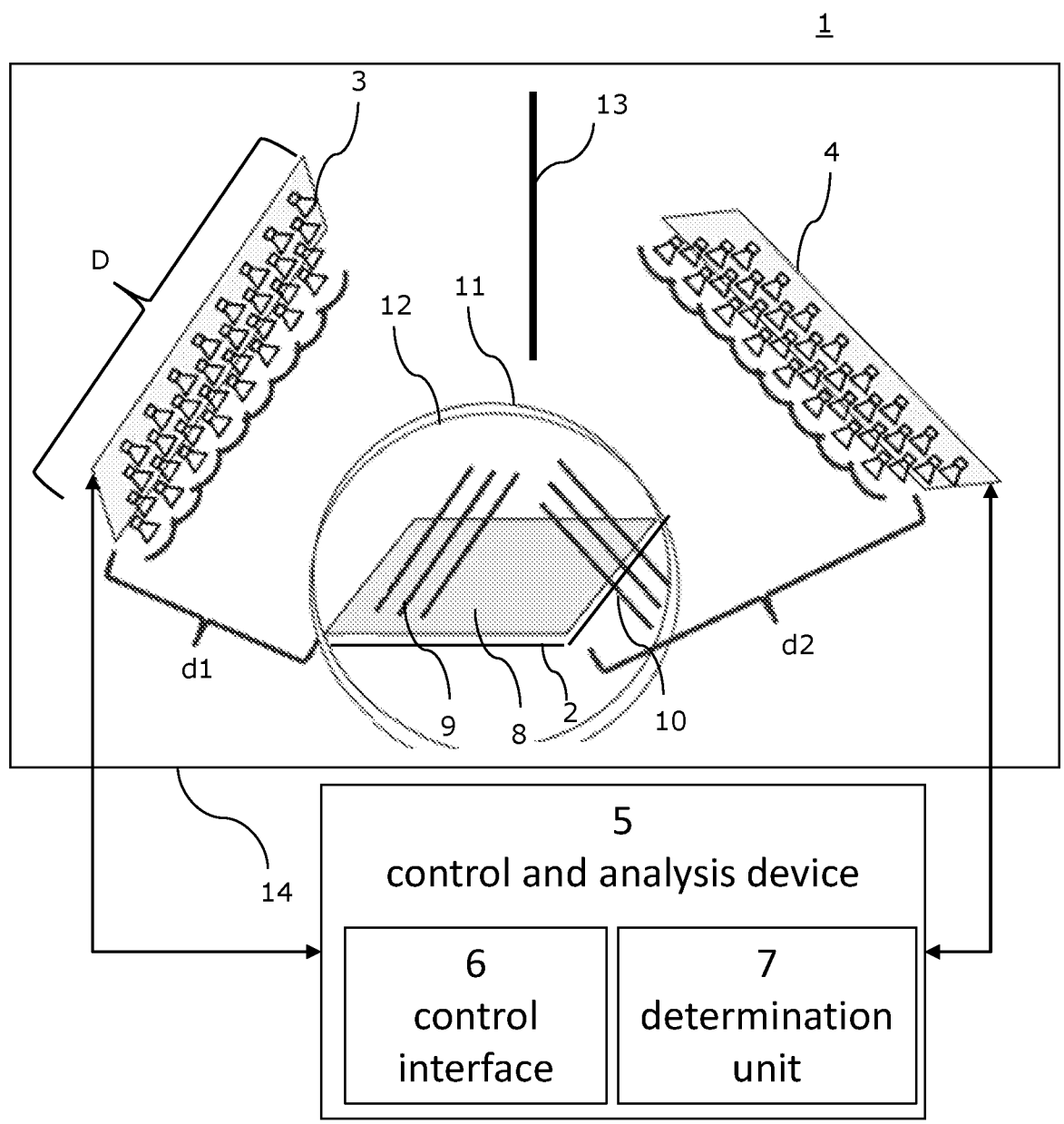
FIG. 1 shows a schematic diagram of a system for testing a DUT according to an embodiment of the invention.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

DETAILED DESCRIPTION OF THE DRAWINGS

FIG. 1 shows a schematic diagram of a system 1 for testing a DUT 8. The DUT 8 may comprise a printed circuit board comprising a plurality of electronic components, e.g. discrete components such as coils or capacitors as well as integrated components such as microprocessors and the like. In particular, the DUT 8 comprises at least one RIS.

The RIS can comprise meta-surfaces which are 2-dimensional objects comprising smaller components which are called meta-cells or meta-atoms and are smaller than the wavelength of the signals which are to be reflected by the meta-surface. The meta-surfaces can control the propagation of the electromagnetic signals but can also be used for modulation of electromagnetic signals or can store electromagnetic pulses for short periods of time.

The RIS can further comprise antenna arrays, e.g. having passive antenna elements arranged in a two-dimensional array. The antenna arrays can be electrically tunable to adjust the radiation properties.

The RIS can absorb signals which can be processed by a microcontroller and can be transmitted in specific directions using the antenna arrays or meta-surfaces. RIS can therefore be used to control the propagation of electromagnetic waves in an efficient way, e.g., to improve the gain at a receiver.

The system 1 comprises a holder 2 configured to hold the DUT 8. The holder 2 can be static.

In other embodiments, the holder 2 can also be movable in two dimensions or three dimensions. The movement can be automated. For example, a specific movement can be predefined which is then automatically performed to bring the holder 2 in the desired positions and/or orientations.

The system 1 further comprises a first antenna array 3 configured to generate plane waves 9 at a position of the at least one RIS when the DUT 8 is arranged on the holder 2. In this way, the interaction of electromagnetic fields from a far field region with the RIS can be tested.

Preferably, the first antenna array 3 is a plane wave converter antenna. The plane wave converter antenna can be a phased antenna array which forms plane waves inside a first quiet zone 11.

The first antenna array 3 can generate plane waves 9 having different angles of incidence at the position of the at least one RIS. For example, the relative phases of signals emitted by the antennas first antenna array 3 can be electronically adjusted in such a way that a specific plane wave with a specific angle of incidence at the position of the at least one RIS is generated.

The system 1 further comprises a second antenna array 4 configured to receive a reflection signal 10 originating from a reflection of a plane wave 9, wherein this plane wave 9 is generated by the first antenna array 3 and is reflected from the at least one RIS. A second quiet zone 12 is associated with the second antenna array 4.

A distance d1 between the first antenna array 3 and the holder 2 as well as a distance d2 between the second antenna array 4 and the holder 2 is preferably smaller than the Fraunhofer distance, $$2 \cdot D^2/\lambda,$$

where D denotes a largest dimension of the first antenna array 3 and $\lambda$ a wavelength of the plane waves emitted by the first antenna array 3.

The first antenna array 3 and the second antenna array 4 can be static.

In other embodiments, the first antenna array 3 is movable and/or the second antenna array 4 is movable. For example, the first antenna array 3 may be arranged on a holding structure which can be electronically controlled to perform a movement in a two-dimensional region of a sphere. The sphere may be arranged around the holder 2, i.e., the holder 2 can be in the center of the sphere.

The holder 2, the first antenna array 3 and the second antenna array 4 are all arranged within an anechoic chamber 14.

The system 1 further comprises an absorber 13, i.e. a structure with a material that can absorb electromagnetic radiation. The absorber 13 is arranged within a direct path between the first antenna array 3 and the second antenna array 4.

The system 1 comprises a control and analysis device 5. The control and analysis device 5 comprises a control interface 6 which is coupled to the first antenna array 3 and the second antenna array 4 and can control the first antenna array 3 and the second antenna array 4. For example, the control interface may control the first antenna array 3 to generate plane waves 9 at a desired angle of incidence at the position of the at least one RIS, e.g., by adjusting relative phases of antennas of the first antenna array 3.

The control device 5 comprises a determination unit 7 for analyzing the reflection signal 10. The determination unit 7 receives the reflection signal 10 and determines, based on the reflection signal 10, an angle of incidence on the second antenna array 4. The determination unit 7 can determine the respective angle of incidence on the second antenna array 4 for each plane wave 9, i.e. for each angle of incidence at the position of the least one RIS.

For example, the determination unit 7 may determine the amplitude and/or relative phase of the reflection signal 10 at different antennas of the antenna array. Based on these values, the angle of incidence on the second antenna array 4 can be measured.

The determination unit 7 may determine whether the determined angle of incidence on the second antenna array 4 is within a predetermined range.

The determination unit 7 may further determine other signal characteristics of the received reflection signal 10. In particular, the determination unit 7 may determine characteristic parameters such as amplitudes, a frequency or a phase shift, e.g. as a function of the angle of incidence on the second antenna array 4.

The components of the control and analysis device 5 (i.e., in particular the control interface 6 and the determination unit 7) may comprise a plurality of single units, like hardware interfaces, communication controllers, processors and the like. For example, the components of the control and analysis device 5 may comprise a central processing unit, a graphics processing unit, a microcontroller, an integrated circuit, an application-specific integrated circuit, a digital signal processor, a field programmable gate array, and the like.

The components of the control and analysis device 5 may further comprise at least one data storage, e.g. a volatile or non-volatile data memory, e.g. a solid-state disk, memory card or the like.

Interfaces, e.g. between the control and analysis device 5 and the first and second antenna arrays 3, 4 may comprise any kind of port or link or interface capable of communicating information to another component, in particular direct cable connections or wireless connections.

In some embodiments, the first antenna array 3 is configured to simultaneously generate at least two plane waves 9 with different angles of incidence at the position of the RIS. For example, the first antenna array 3 may comprise a plurality of subarrays. Each subarray can be configured to generate a plane wave 9 at a respective angle of incidence at the position of the RIS which differs from the angles of incidence at the position of the RIS of the plane waves emitted by the other subarrays.

Figure 2:
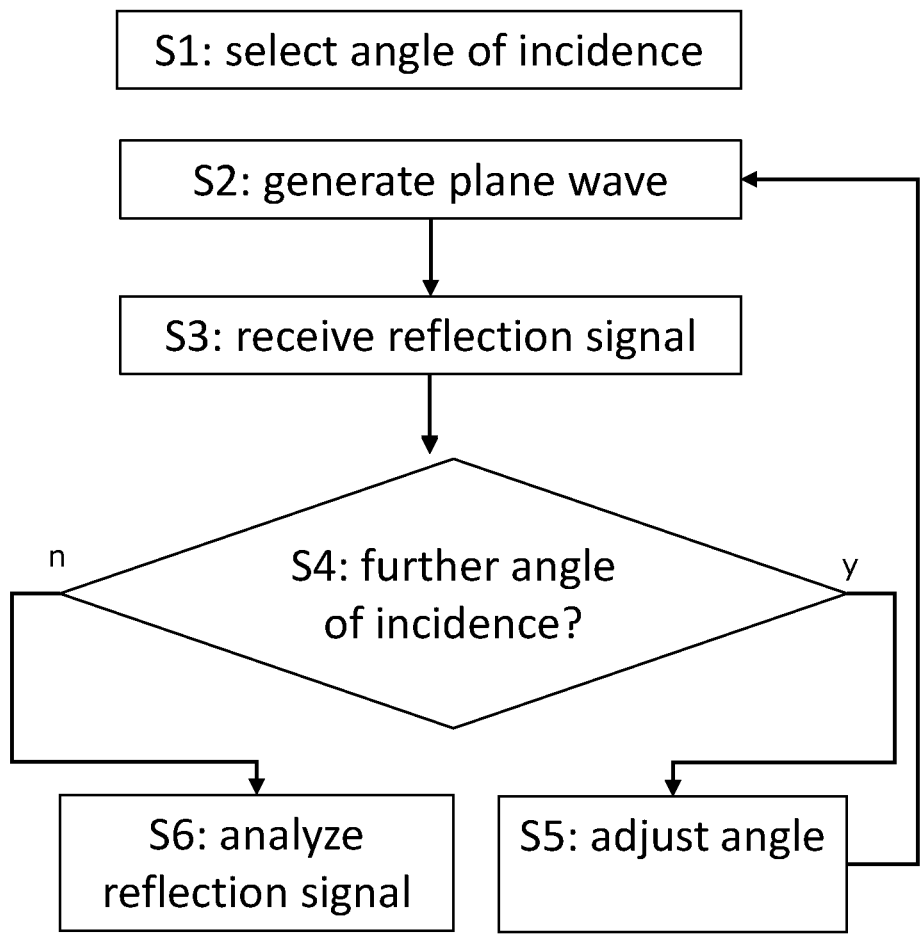
FIG. 2 shows a flow diagram illustrating a method for testing a DUT according to an embodiment of the invention.

FIG. 2 shows a flow diagram illustrating a method for testing a DUT 8 according to an embodiment of the invention. The method can be performed with the system 1 for testing the DUT 8 described in the context of FIG. 1 above.

The DUT 8 comprises at least one RIS, in particular one of the types of RIS described above. The DUT 8 is arranged on a holder 2. The holder 2 can be static or can be movable in two or three dimension.

In a first step S1, a first angle of incidence at a position of the RIS is selected from a list. The list comprises at least two angles of incidence of the plane wave 9 at the position of the RIS.

In a second step S2, a first antenna array 3 generates plane waves 9 at a position of the at least one RIS, when the DUT 8 is arranged on a holder 2. The first antenna array 3 can be a plane wave converter antenna.

The first antenna array 3 generates plane waves 9 for the selected angles of incidence at the position of the at least one RIS. The first antenna array 3 may start by generating a first plane waves 9 having the first angle of incidence at the position of the at least one RIS from the list.

In a third step S3, a second antenna array 4 receives, for each plane wave 9 generated by the first antenna array 3, a respective reflection signal 10 originating from a reflection of said plane wave 9 from the at least one RIS.

The distance between the first antenna array 3 and the holder 2 as well as the distance between the second antenna array 4 and the holder 2 are preferably each smaller than the Fraunhofer distance, $2 \cdot D^2 / \lambda$.

The first antenna array 3 and the second antenna array 4 can be static but can also be movable. In particular, the first antenna array 3 can in some embodiments be electronically controlled to perform a movement in a two-dimensional region of a sphere, the sphere being arranged around the holder 2.

Components of the testing system 1, in particular the holder 2, the first antenna array 3 and the second antenna array 4 can be arranged within an anechoic chamber 14 to reduce inferences from the environment.

To reduce crosstalk, an absorber 13 can be arranged within a direct path between the first antenna array 3 and the second antenna array 4.

In step S4, it is determined whether the list comprises a further angle of incidence at the position of the RIS.

If this is the case, in step S5 the next angle of incidence at the position of the RIS from the list is selected and the first antenna array 3 is controlled to generate plane waves 9 having the selected angle of incidence at the position of the RIS. The first antenna array 3 is adjusted accordingly, e.g., by changing relative phases between antennas of the first antenna array 3. The method repeats at step S2.

If the list does not contain any further angles of incidence at the position of the RIS, the reflection signal 10 is analyzed in step S6. The analysis of the reflection signal 10 comprises determining, for each plane wave 9 generated by the first antenna array 3 (i.e. for each angle of incidence at the position of the RIS in the list), a respective angle of incidence on the second antenna array 4.

The angle of incidence on the second antenna array 4 can be determined, for example, based on phase differences of the reflection signal 10 at different antenna elements of the second antenna array 4. It can be checked whether the determined angle of incidence on the second antenna array 4 is within a predetermined range. The user can be notified of the result, e.g., if determined angle of incidence can be provided or the user can be informed if the determined angle of incidence is within or outside a predetermined range.

The invention is not restricted to the described method. In particular, in other embodiments, each reflection signal 10 can be analyzed directly after the reflection signal 10 is received, i.e., before the next plane wave is generated. The analysis of the signals can also be performed in parallel to the generation of the plane waves 9 and the reception of the reflection signal 10.

In yet another embodiment, at least two plane waves 9 with different angles of incidence at the position of the RIS may be generated simultaneously. For example, the first antenna array 3 may have at least two subarrays which generate the plane waves 9 at different angles of incidence.

In other embodiments, there is a plurality of first antenna arrays 3 and/or a plurality of second antenna arrays 4. Each first antenna array 3 may generate a respective plane wave and each second antenna array 4 may receive reflection signals 10. In some embodiments, each second antenna array 4 is associated with a corresponding first antenna array 3, i.e., primarily receives the reflection signals from the corresponding first antenna array 3.

Summarizing, the invention relates to a compact system 1 for testing a DUT comprising at least one RIS. A first antenna array 3 generates plane waves at different angles of incidence at the position of the RIS and a second antenna array 4 receives the corresponding reflection signal. The distance between the DUT 8 and the antenna arrays 3, 4 can be much smaller than the Fraunhofer distance.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

The invention claimed is:

1. A system for testing a device under test, DUT, wherein the DUT comprises at least one reconfigurable intelligent surface, RIS, wherein the system comprises:
    a holder configured to hold the DUT;
    a first antenna array configured to generate plane waves at a position of the at least one RIS when the DUT is arranged on the holder, wherein the first antenna array is configured to generate plane waves having different angles of incidence at the position of the at least one RIS; and
    a second antenna array configured to receive a reflection signal originating from a reflection of a plane wave being generated by the first antenna array and being reflected from the at least one RIS; and
    a determination unit configured to determine an angle of incidence on the second antenna array, using the received reflection signal.

2. The system according to claim 1, wherein the determination unit is configured to determine whether the determined angle of incidence on the second antenna array is within a predetermined range.

3. The system according to claim 1, further comprising an anechoic chamber, wherein the holder, the first antenna array and the second antenna array are arranged within the chamber.

4. The system according to claim 1, further comprising at least one absorber configured to absorb electromagnetic radiation, wherein the at least one absorber is arranged at least partially within a direct path between the first antenna array and the second antenna array.

5. The system according to claim 1, wherein the holder is static.

6. The system according to claim 1, wherein the holder is configured to be movable in two dimensions or three dimensions.

7. The system according to claim 1, wherein the first antenna array and the second antenna array are static.

8. The system according to claim 1, wherein at least one of the first antenna array and the second antenna array are configured to be movable.

9. The system according to claim 8, wherein the at least one of the first antenna array and the second antenna array are configured to be movable on at least a portion of a sphere.

10. The system according to claim 1, wherein a distance between the first antenna array and the holder and a distance between the second antenna array and the holder are smaller than $2 \cdot D^2/\lambda$, wherein D denotes a largest dimension of the first antenna array and $\lambda$ denotes a wave length of the plane waves generated by the first antenna array.

11. The system according to claim 1, wherein the first antenna array is a plane wave converter antenna.

12. A method for testing a device under test, DUT, wherein the DUT comprises at least one reconfigurable intelligent surface, RIS, wherein the method comprises the steps:
    generating, by a first antenna array, plane waves at a position of the at least one RIS, wherein the DUT is arranged on a holder, and wherein the first antenna array is controlled to generate plane waves for at least two different angles of incidence at the position of the at least one RIS;
    receiving, by a second antenna array, for each plane wave generated by the first antenna array, a respective reflection signal originating from a reflection of said plane wave from the at least one RIS; and
    determining, for each plane wave generated by the first antenna array, a respective angle of incidence on the second antenna array, using the respective reflection signal.

13. The method according to claim 12, further comprising the step of determining, for each plane wave generated by the first antenna array, whether the respective determined angle of incidence on the second antenna array is within a predetermined range.

14. The method according to claim 12, further comprising the step of moving the holder.

15. The method according to claim 12, further comprising the step of moving at least one of the first antenna array and the second antenna array.

* * * * *